(12) United States Patent
Avizonis et al.

(10) Patent No.: US 6,768,304 B2
(45) Date of Patent: Jul. 27, 2004

(54) ON-FLOW PREHEATING IN NMR MEASUREMENTS

(75) Inventors: Daina Z. Avizonis, Redwood City, CA (US); Igor Goljer, Parkesburg, PA (US)

(73) Assignee: Varian, Inc., Palo Alto, CA (US)

( * ) Notice: Subject to any disclaimer, the term of this patent is extended or adjusted under 35 U.S.C. 154(b) by 209 days.

(21) Appl. No.: 10/082,488

(22) Filed: Feb. 22, 2002

(65) Prior Publication Data

US 2003/0162302 A1 Aug. 28, 2003

(51) Int. Cl.[7] .................................................. G01V 3/00
(52) U.S. Cl. ...................................................... 324/315
(58) Field of Search ................................. 324/300, 306, 324/307–309, 315, 318, 321, 322, 314

(56) References Cited

U.S. PATENT DOCUMENTS

| | | | | |
|---|---|---|---|---|
| 4,291,271 A | * | 9/1981 | Lauffer | 324/307 |
| 5,146,166 A | * | 9/1992 | Bartuska | 324/321 |
| 5,300,888 A | | 4/1994 | Webster et al. | |
| 5,530,353 A | * | 6/1996 | Blanz | 324/315 |
| 5,552,709 A | * | 9/1996 | Anderson | 324/321 |
| 5,705,928 A | | 1/1998 | Haner et al. | |
| 5,867,026 A | * | 2/1999 | Haner | 324/321 |
| 6,101,015 A | * | 8/2000 | Budil et al. | 324/316 |
| 6,177,798 B1 | | 1/2001 | Haner et al. | |
| 6,218,835 B1 | | 4/2001 | Smallcombe | |
| 6,437,570 B2 | * | 8/2002 | Marek | 324/321 |
| 6,441,617 B2 | * | 8/2002 | Marek | 324/318 |
| 6,466,019 B2 | * | 10/2002 | Marek | 324/318 |
| 6,515,260 B1 | * | 2/2003 | Anderson | 219/385 |
| 2001/0015646 A1 | | 8/2001 | Bruker | |

FOREIGN PATENT DOCUMENTS

WO          WO 97/42516 A        8/2001

* cited by examiner

*Primary Examiner*—Diego Gutierrez
*Assistant Examiner*—Dixomara Vargas
(74) *Attorney, Agent, or Firm*—Bella Fishman

(57) ABSTRACT

An NMR experiment is carried out with a probe having an inlet tubing connected to a flow cell and a twisted-pair wire is tightly wrapped around the inlet tubing in a helical manner to serve as a heater. As a sample liquid flows from a sample source into the flow cell, it is preheated such that the time taken for it to reach thermal equilibrium is reduced. The use of a twisted-pair wire as a heater minimizes the effect of induced magnetic field. A control device includes a temperature sensor for sensing the temperature at the inlet tubing to control the electric current for the heater to maintain the preheating temperature at a selected level.

10 Claims, 5 Drawing Sheets

ON-FLOW PREHEATING IN NMR MEASUREMENTS

BACKGROUND OF THE INVENTION

This invention is in the technical field of nuclear magnetic resonance (NMR) measurements. More particularly, the invention relates to a method and apparatus for controlling temperature of liquid samples before and during an NMR measurement in an NMR spectrometer.

In high throughput NMR techniques, saving time is of paramount importance. Most high throughput NMR techniques use a flow probe, and a liquid sample is pushed into the NMR probe through a tubing with a small inner diameter to an active region, or a flow cell of the probe. Thereafter, precious time is lost in heating the sample to thermal equilibrium. The time to reach thermal equilibrium in a currently used NMR probe of a prior art design may be two minutes or longer, depending upon the desired end temperature.

SUMMARY OF THE INVENTION

It is a general object of this invention to improve the throughput time in NMR measurements.

It is a particular object of this invention to provide a method and apparatus for preheating a liquid sample being pushed into an NMR probe without disturbing the magnetic field for the measurement.

For carrying out an NMR experiment according to the present invention, the inlet tubing through which a sample liquid flows from a sample source into a flow cell is provided with a heater comprising a twisted-pair wire tightly wrapped around helically such that the sample liquid is preheated as it flows into the flow cell and hence that the time taken for it to reach thermal equilibrium is reduced. The use of a twisted-pair wire as a heater minimizes the effect of induced magnetic field. A process control device, commercially available, may be used to monitor and control the temperature of the inlet tubing and thereby controlling the electric current through the heater such that the temperature can be maintained at a desired level.

DETAILED DESCRIPTION OF THE INVENTION

Figure 1:
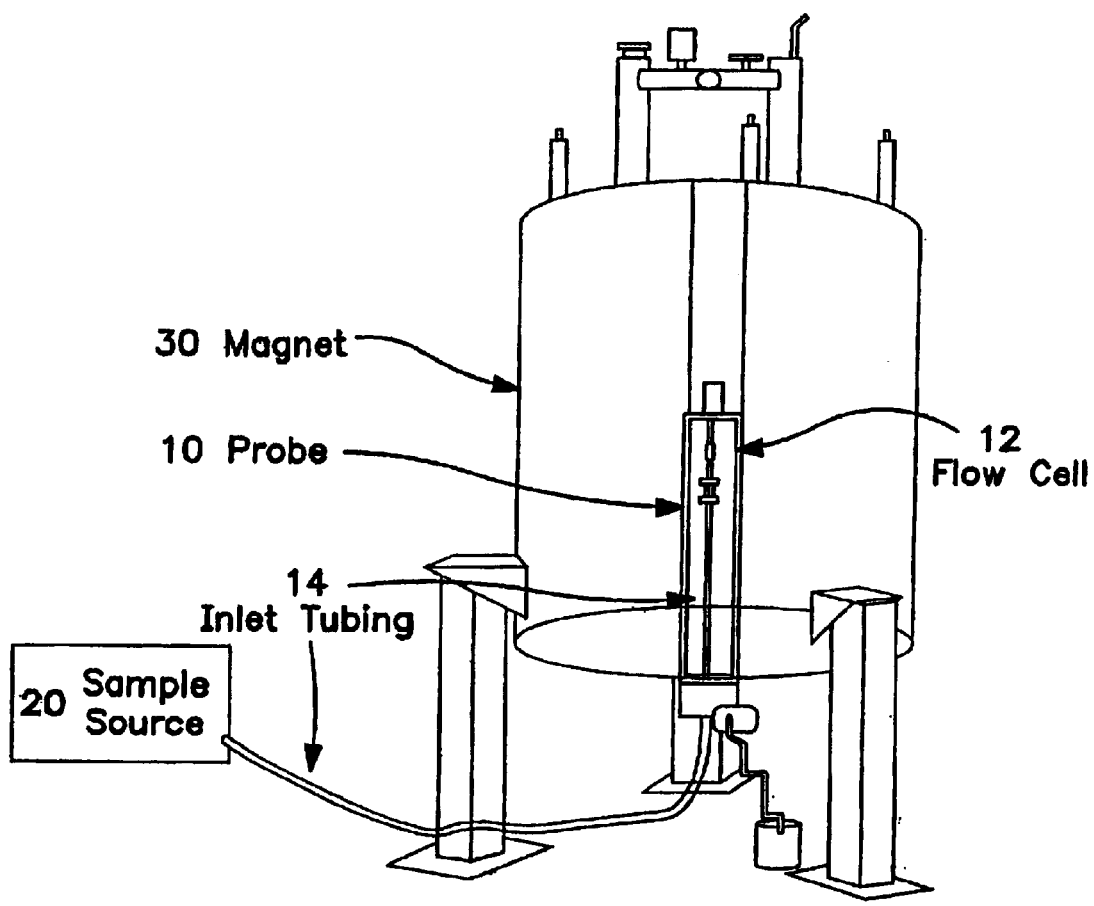
FIG. 1 is a schematic view of an NMR probe embodying this invention set for an NMR experiment.

FIG. 1 shows the general setup for an NMR experiment according to this invention. Numeral 10 indicates an NMR probe including a flow cell 12 and an inlet tubing 14 serving as a liquid transfer line through which a sample liquid is to flow into the flow cell 12 from a sample source 20 which may be a high pressure liquid chromatography (HPLC) system or a liquid handling robot of a known kind. The NMR probe 10 is positioned inside a high-field magnet 30 such that the flow cell 12 is centered in the active regions of its coils necessary for NMR spectroscopy.

Figure 2:
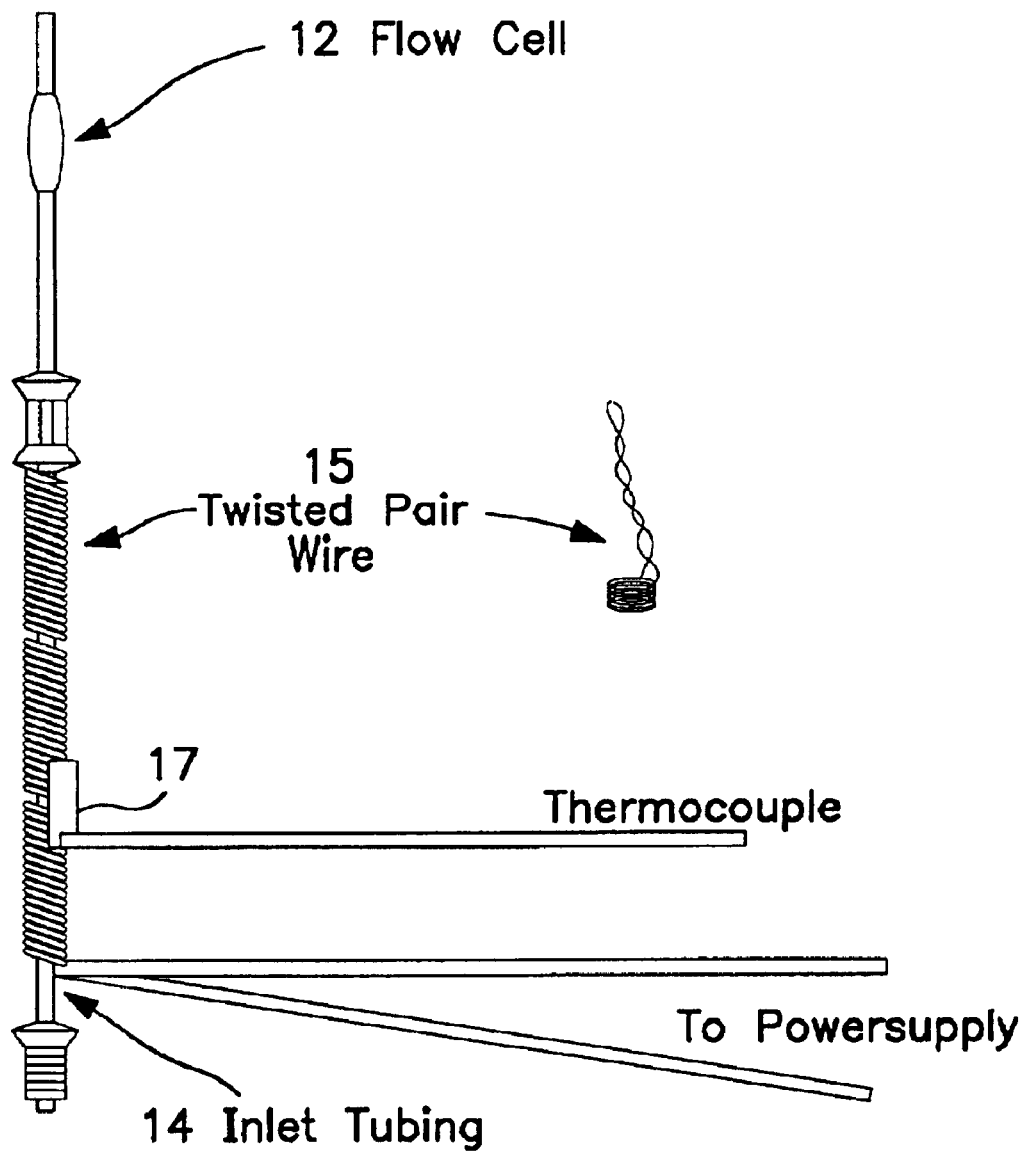
FIG. 2 is a schematic external view of the components of the NMR probe shown in FIG. 1.

As shown more clearly in FIG. 2, the inlet tubing 14 to the flow cell 12 has a twisted-pair wire 15 tightly and helically wrapped around and connected to a power supply source (not shown) so as to serve as its heater. Fittings of a known kind are used to connect the flow cell 12 with the inlet tubing 14.

The twisted-pair wire 15 is used as the heater for the inlet tubing 14 in order to reduce the induced magnetic field caused by the current traveling through the heater wire such that the critically important homogeneity condition for the high-field magnet 30 can be maintained.

Numeral 17 indicates a thermocouple for sensing the temperature at the inlet tubing 14. Although not shown, a commercially available external temperature controller is provided to control the temperature of the inlet tubing 14 according to the temperature sensed by the thermocouple 17.

A method of NMR experiment embodying this invention is therefore characterized as including a step of preheating a sample liquid which passes through the inlet tubing 14 into the flow cell 12 of the NMR probe 10. As the sample liquid flows from the sample source 20, it begins to be heated inside the inlet tubing 14 serving as the transfer line, or just as it enters the probe 10. Because the liquid tends to be a small flowing stream of liquid traveling at rates between 1–4 ml/minute, it can be preheated in the inlet tubing 14.

It is well known in electronics that when a current is streaming through a coiled wire, a magnetic field is thereby induced. Since the preheating process is carried out by means of a heater comprised of a twisted-pair wire 15, two equal and opposite magnetic fields are produced which serve to cancel each other and hence do not disturb the overall homogeneity of the magnetic field necessary for high quality NMR spectroscopy.

The temperature at the inlet tubing 14 is monitored and the current for the heater is controlled according to the temperature sensed by the thermocouple 17.

Figure 3:
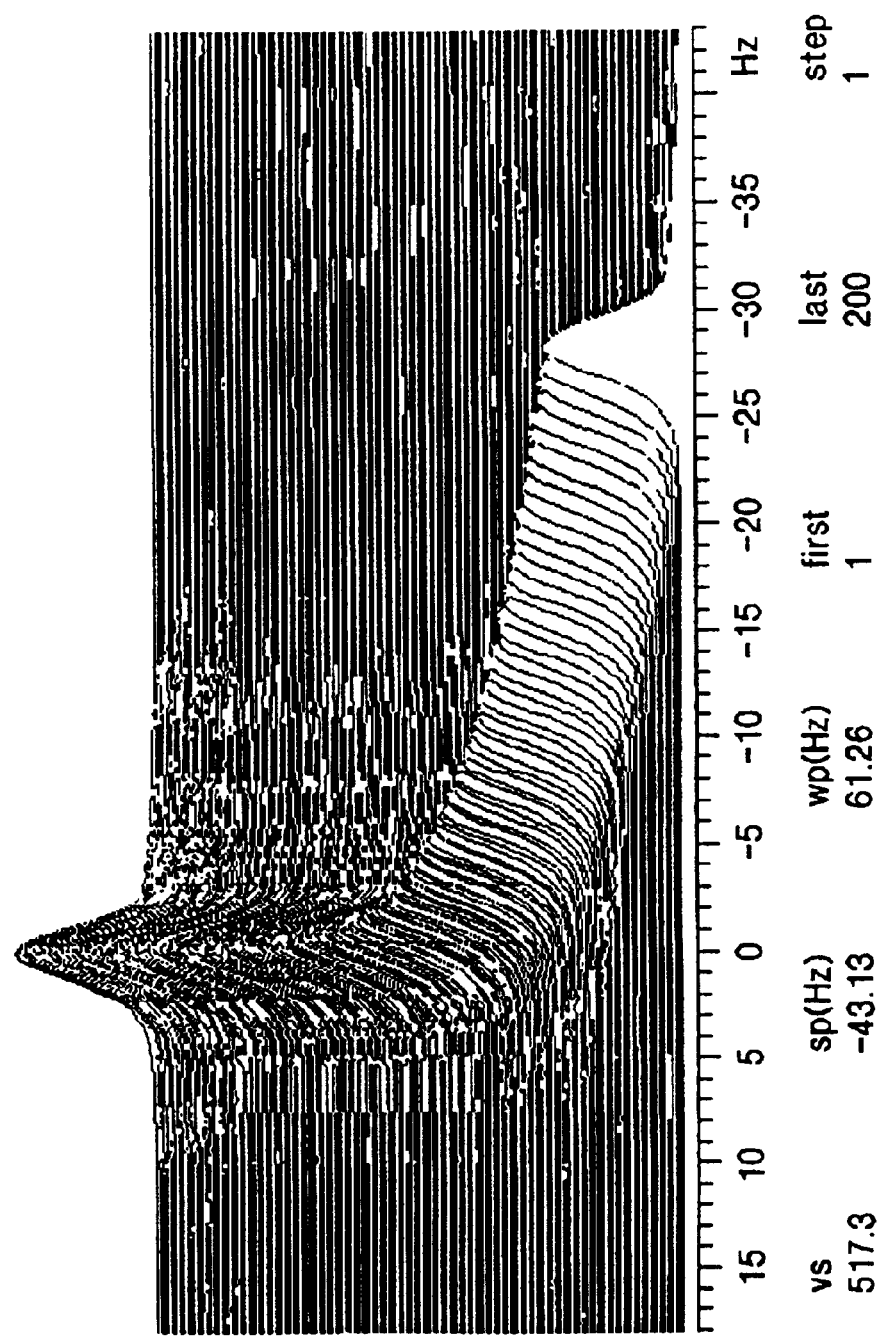
FIGS. 3, 4 and 5 are diagrams of spectra of NMR signals collected at different times after a sample liquid is injected into an NMR probe of this invention by varying the temperature of the preheating element and the amount of injected sample liquid.
Figure 4:
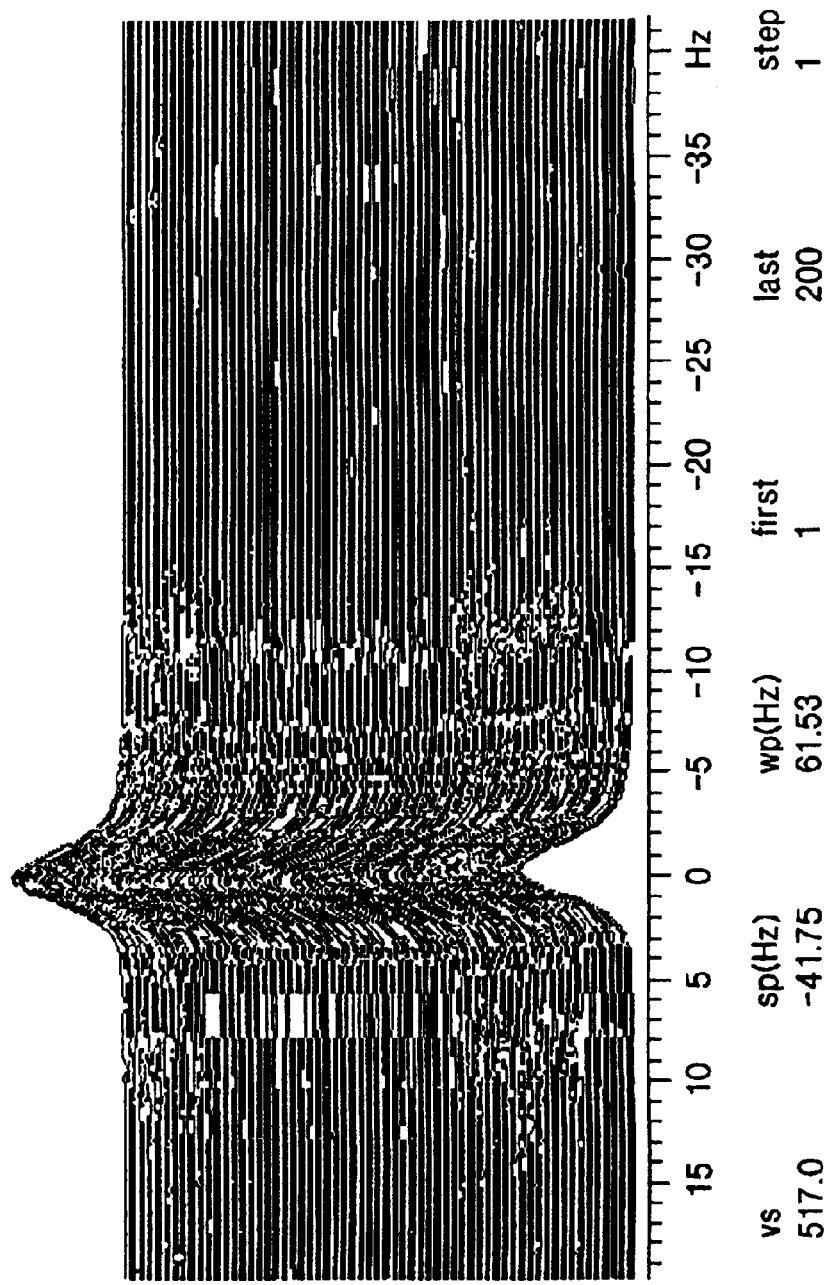
Figure 5:
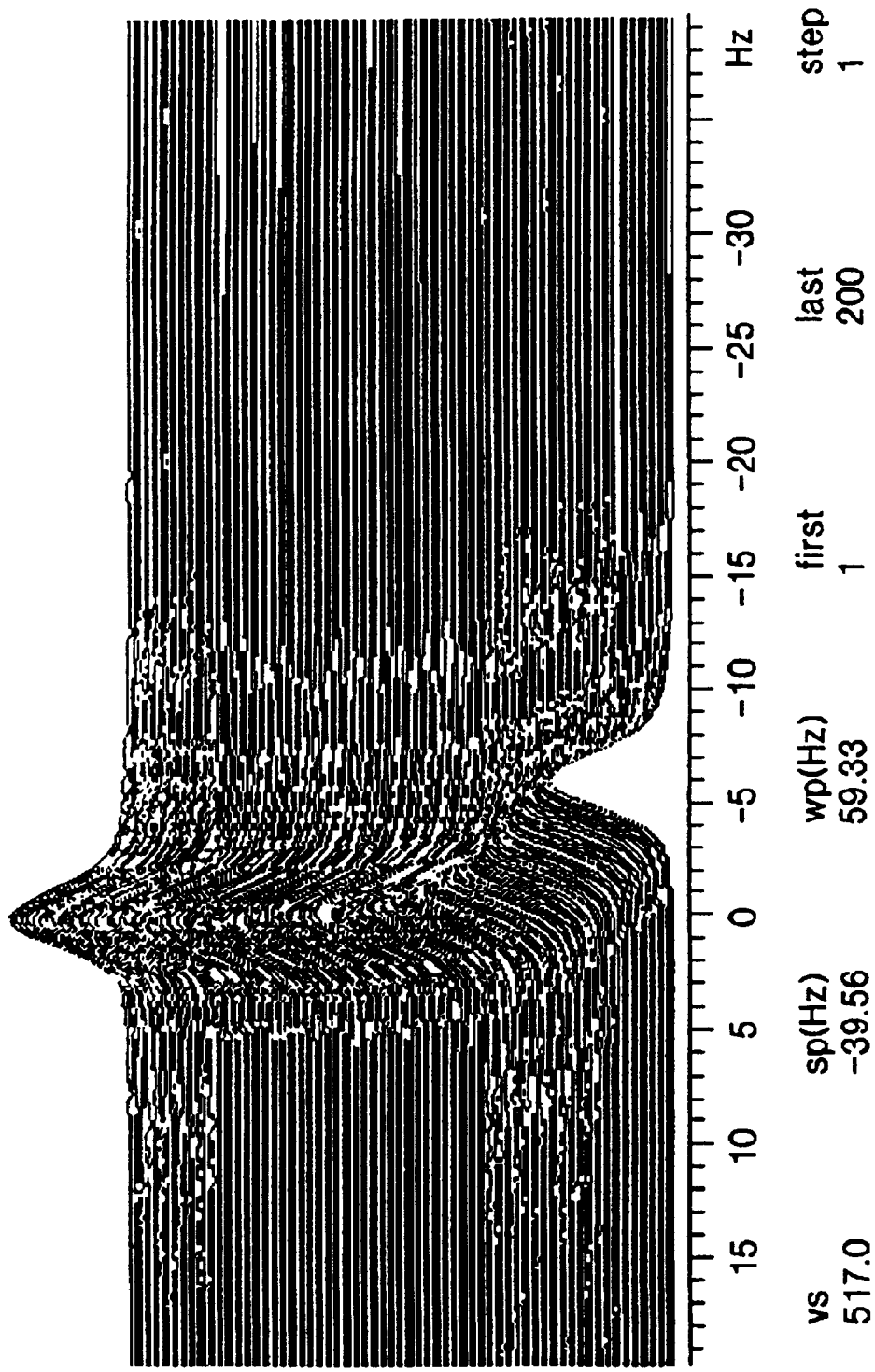

The invention is described next by way of experimental results obtained by using a model probe produced as embodying this invention. A water sample containing 10% heavy water, sodium chloride and disodium dihydrogen ethylenediaminetetraacetate (EDTA) was used for the testing. This sample has temperature-dependent chemical shifts which were used as markers. As the sample warms, the resonance frequency of the EDTA changes relative to the water signal since the spectrometer is locked on the heavy water. Once the resonance frequency stops changing, the sample may be considered to be at thermal equilibrium. Thus, the time it takes to reach a state of thermal equilibrium can be determined. FIGS. 3, 4 and 5 show that preheating of the sample liquid significantly reduces the time required for thermal equilibrium inside the active region of the probe 10, or the flow cell 12.

FIG. 3 shows the spectra of temperature sensitive NMR signals collected immediately after 1 ml of fluid was injected into the flow probe without preheating. The frequency of the signal changes as the temperature of the sample is equilibrating from 22° C. to 48° C. The liquid in the flow cell is considered equilibrated when the frequency of the signal becomes stable. The time to reach equilibrium in this experiment was 95 seconds.

FIG. 4 shows the spectra obtained by setting the preheating temperature to 48° C. The NMR measurements of temperature-sensitive signals were started immediately after 0.5 ml of the fluid was injected into the flow probe with the preheated inlet tubing 14. The equilibration time was significantly reduced to approximately 5 seconds without compromising field homogeneity.

FIG. 5 shows the effects of preheating after 1.0 ml of fluid was injected with the preheating temperature set also at 48° C. The equilibration time is seen to have been reduced approximately to 30 seconds. The user may adjust the temperature of the preheating according to the injected volume of the sample to minimize the equilibration time since the equilibration time depends not only on the temperature of the preheating but also on the amount of the sample fluid which is injected.

What is claimed is:

1. A method of NMR measurement comprising the steps of:
   providing an NMR probe including a flow cell and an inlet tubing connected to said flow cell;
   tightly and helically wrapping a twisted-pair wire around a length of said inlet tubing forming a double twist thereto and connecting said twisted-pair wire to a power supply;
   directly heating a sample liquid passing via said inlet tubing to said flow cell by causing an electric current to pass through said twisted-pair wire and distributing heat evenly along said inlet tubing;
   injecting said liquid sample into said flow cell, said sample liquid having a pre-heated temperature comparable to the temperature within said flow cell; and
   collecting NMR data to analyze said sample liquid within said flow cell.

2. The method of claim 1 further comprising the step of generating a homogeneous magnetic field around said NMR probe.

3. The method of claim 2, further comprising the steps of monitoring the temperature at said inlet tubing and controlling said electric current according to said monitored temperature for maintaining said input tubing at a temperature comparable to the temperature within said flow cell.

4. The method of claim 3, further comprising the step of selecting said temperature of said input tubing according to an amount of said sample liquid in order to minimize the time taken by said sample liquid to reach thermal equilibrium.

5. The method of claim 1, further comprising the steps of monitoring the temperature at said inlet tubing and controlling said electric current according to said monitored temperature for maintaining said input tubing at a temperature comparable to the temperature with said flow cell.

6. The method of claim 5, further comprising the step of selecting said temperature of said input tubing according to an amount of said sample liquid in order to minimize the time taken by said sample liquid to reach thermal equilibrium.

7. An apparatus for NMR measurement comprising:
   an NMR probe including a flow cell and an inlet tubing connected to said flow cell;
   a heater having a twisted-pair wire tightly and helically wound around a length of said inlet tubing forming a double twist thereto;
   an electric power source for causing an electric current to pass through said twisted-pair wire to thereby generate heat; and
   means for causing a sample liquid to pass through said inlet tubing into said flow cell of said NMR probe, wherein said sample liquid is preheated directly by the heat from said heater prior to reaching said flow cell.

8. The apparatus of claim 7, further comprising means for providing a homogeneous magnetic field around said NMR probe, wherein said electric current through said twisted-pair wire does not disturb said homogeneous magnetic field.

9. The apparatus of claim 8, further comprising means for monitoring the temperature at said inlet tubing and controlling said electric current according to said monitored temperature.

10. The apparatus of claim 7, further comprising means for monitoring the temperature at said inlet tubing and controlling said electric current according to said monitored temperature.

* * * * *